United States Patent
Nomura et al.

(10) Patent No.: US 8,421,182 B2
(45) Date of Patent: Apr. 16, 2013

(54) FIELD EFFECT TRANSISTOR HAVING MOS STRUCTURE MADE OF NITRIDE COMPOUND SEMICONDUCTOR

(75) Inventors: Takehiko Nomura, Tokyo (JP); Seikoh Yoshida, Tokyo (JP); Sadahiro Kato, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 517 days.

(21) Appl. No.: 12/639,199

(22) Filed: Dec. 16, 2009

(65) Prior Publication Data

US 2010/0127307 A1    May 27, 2010

Related U.S. Application Data

(63) Continuation of application No. 12/457,119, filed on Jun. 1, 2009, now abandoned, which is a continuation of application No. 12/130,535, filed on May 30, 2008, now abandoned.

(30) Foreign Application Priority Data

Jun. 1, 2007   (JP) .................................. 2007-147466

(51) Int. Cl.
*H01L 31/062*    (2006.01)

(52) U.S. Cl.
USPC ............................ 257/492; 257/192; 257/335

(58) Field of Classification Search .................. 257/192, 257/335, 492
See application file for complete search history.

(56) References Cited

U.S. PATENT DOCUMENTS 7,449,762 B1 *   11/2008   Singh ........................... 257/493

* cited by examiner

*Primary Examiner* — Marcos D. Pizarro
*Assistant Examiner* — Tifney L Skyles
(74) *Attorney, Agent, or Firm* — Kubotera & Associates, LLC

(57) ABSTRACT

A semiconductor layer of a second conductive type is formed on a RESURF layer of a first conductive type that is formed on a buffer layer. A contact layer of the first conductive type is formed in or on the semiconductor layer. A source electrode is formed on the contact layer. A drain electrode is formed on the RESURF layer. A gate insulating film is formed on the semiconductor layer to overlap with an end of the semiconductor layer. A gate electrode is formed on the gate insulating film to overlap with the end of the semiconductor layer. A channel formed near the end of the semiconductor layer is electrically connected to the RESURF layer.

4 Claims, 5 Drawing Sheets

FIELD EFFECT TRANSISTOR HAVING MOS STRUCTURE MADE OF NITRIDE COMPOUND SEMICONDUCTOR

CROSS-REFERENCE TO RELATED APPLICATIONS

This application is a continuation application of the prior application Ser. No. 12/457,119 filed Jun. 1, 2009 now abandoned, which is a continuation application of the prior application Ser. No. 12/130,535 filed May 30, 2008, abandoned. This application claims priority from a Japanese patent application serial No. 2007-147466 filed on Jun. 1, 2007, the entire content of which is incorporated herein by the reference.

BACKGROUND OF THE INVENTION

1. Field of the Invention

The present invention relates to a technology for manufacturing a filed effect transistor.

2. Description of the Related Art

A wide band-gap semiconductor such as III-V nitride compound is preferably used as a material for high-power, high-frequency, and high-temperature semiconductor devices, because the wide band-gap semiconductor has high breakdown voltage and good thermal conductivity. For example, a field effect transistor (FET) having an AlGaN/GaN heterostructure induces two-dimensional electron gas at an interface by piezoelectric effect. The two-dimensional electron gas has high electron mobility and high career density so that it is widely tested for a practical use. In addition, an AlGaN/GaN heterostructure field effect transistor (HFET) has a low ON-resistance and a fast switching speed, which realizes a high temperature operation. The above characteristics are preferable for power switching application.

Generally, the AlGaN/GaN HFET is configured as a normally-on type device, in which current flows when bias is not applied to a gate and the current is blocked when negative voltage is applied to the gate. However, for the power switching application, it is more preferable to use a normally-off type device, in which the current is blocked when bias is not applied to the gate and the current flows when positive voltage is applied to the gate, so that a security is assured even when a failure occurs in the device.

To realize the normally-off type device, it is necessary to employ a metal-oxide-semiconductor field-effect transistor (MOSFET) structure. FIG. 5 is a schematic side view of a conventional MOSFET 500 as disclosed in a document by Matocha K., Chow T. P., and Gutmann R. J., "High-voltage normally off GaN MOSFETs on sapphire substrates", IEEE Transactions on Electron Devices. vol. 52, No. 1, pp. 6-10 (2005). A buffer layer 502 and a p-type gallium nitride (p-GaN) layer 504 are formed in that order on a substrate 501 in the MOSFET 500. Two n$^+$GaN regions 505$a$ and 505$b$, as contact layers to realize an ohmic contact between source and drain regions, are formed on a portion of the p-GaN layer 504 by an ion implantation method. An n$^-$-GaN region 503 called a reduced surface field (RESURF) layer is formed between a gate region and a drain region by the ion implantation method, so that a local electric field concentration between the gate and the drain regions is reduced and the breakdown voltage of the device is enhanced. An oxide film 506 made of SiO$_2$ or the like is deposited as a gate insulating film and a gate electrode 507 is formed on the oxide film 506. The gate electrode 507 can be made of metal such as poly-Si, Ni/Au, and WSi. A source electrode 508 and a drain electrode 509 are formed on the n$^+$GaN regions 505$a$ and 505$b$, respectively. The source electrode 508 and the drain electrode 509 are made of metal that realizes the ohmic contact to the n$^+$GaN region, such as Ti/Al or Ti/AlSi/Mo.

For realizing preferable channel mobility, the MOSFET needs to be configured in such a manner that a low interface state is maintained between the oxide film and the semiconductor. With a normal Si-based MOSFET, an SiO$_2$ thermally-oxidized film made of thermally-oxidized Si is used as the oxide film, so that preferably low interface state is realized. On the other hand, with a nitride-compound-based MOSFET, a preferable thermally-oxidized film cannot be obtained, so that the oxide film is generally formed from SiO$_2$ by a plasma enhanced chemical vapor deposition (p-CVD) method.

For forming the n$^+$GaN region and the n$^-$-GaN region, the ion implantation method is conventionally used as described above. In the ion implantation method, an annealing process for restoring crystal defect and activating implanted impurity ions is performed after implanting predetermined impurity ions. If the semiconductor is made of GaN, because crystal binding is strong, the annealing process needs to be performed at a high temperature such as more than 1200° C.

However, if the impurity ions are not sufficiently activated by the annealing process, a leakage current increases, the electron mobility in the RESURF layer is degraded, and breakdown voltage characteristic of the RESURF layer is enhanced, due to inactive impurity ions.

On the other hand, if the annealing process is performed at a high temperature for fully activating the impurity ions, pits occur on the surface of a GaN layer of the oxide film, resulting in degrading quality of GaN/oxide film interface and channel mobility.

SUMMARY OF THE INVENTION

It is an object of the present invention to at least partially solve the problems in the conventional technology.

According to an aspect of the present invention, there is provided a field effect transistor having a metal-oxide-semiconductor structure made of nitride compound semiconductor, including a substrate on which a buffer layer is formed; a reduced surface field layer of a first conductive type formed on the buffer layer; a semiconductor layer of a second conductive type formed on a portion of the reduced surface field layer; a contact layer of the first conductive type formed in or on the semiconductor layer; a source electrode formed on the contact layer; a drain electrode formed on the reduced surface field layer; a gate insulating film formed on the semiconductor layer such that the gate insulating film overlaps with an end portion of the semiconductor layer; and a gate electrode formed on the gate insulating film such that the gate electrode overlaps with the end portion of the semiconductor layer. A channel formed near the end portion of the semiconductor layer is electrically connected to the reduced surface field layer.

Furthermore, according to another aspect of the present invention, there is provided a field effect transistor having a metal-oxide-semiconductor structure made of nitride compound semiconductor, including a substrate on which a buffer layer is formed; a reduced surface field layer of a first conductive type formed on the buffer layer; a semiconductor layer of a second conductive type formed on a portion of the reduced surface field layer; a contact layer of the first conductive type formed in or on the semiconductor layer; a source electrode formed on the contact layer; a drain electrode formed on the reduced surface field layer; a channel forming region of the first conductive type formed on an end portion of the semiconductor layer on the drain electrode side; a gate insulating film formed on the semiconductor layer such that the gate insulating film overlaps with the channel forming region; and a gate electrode formed on the gate insulating film such that the gate electrode overlaps with the channel forming region. A channel formed on the channel forming region is electrically connected to the reduced surface field layer.

Moreover, according to still another aspect of the present invention, there is provided a method of manufacturing a field effect transistor having a metal-oxide-semiconductor structure made of nitride compound semiconductor. The method includes forming a buffer layer on a substrate; forming a reduced surface field layer of a first conductive type on the buffer layer; forming a semiconductor layer of a second conductive type on a portion of the reduced surface field layer; forming a contact layer of the first conductive type in or on the semiconductor layer; forming a source electrode on the contact layer; forming a drain electrode on the reduced surface field layer; forming a gate insulating film on the semiconductor layer such that the gate insulating film overlaps with an end portion of the semiconductor layer; and forming a gate electrode on the gate insulating film such that the gate electrode overlaps with the end portion of the semiconductor layer.

Furthermore, according to still another aspect of the present invention, there is provided a method of manufacturing a field effect transistor having a metal-oxide-semiconductor structure made of nitride compound semiconductor. The method includes forming a buffer layer a substrate; forming a reduced surface field layer of a first conductive type on the buffer layer; forming a semiconductor layer of a second conductive type on a portion of the reduced surface field layer; forming a contact layer of the first conductive type in or on the semiconductor layer; forming a source electrode on the contact layer; forming a drain electrode on the reduced surface field layer; forming a channel forming region of the first conductive type on an end portion of the semiconductor layer on the drain electrode side; forming a gate insulating film on the semiconductor layer such that the gate insulating film overlaps with the channel forming region; and forming a gate electrode on the gate insulating film such that the gate electrode overlaps with the channel forming region.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of the present invention are explained in detail below with reference to the accompanying drawings.

Figure 1:
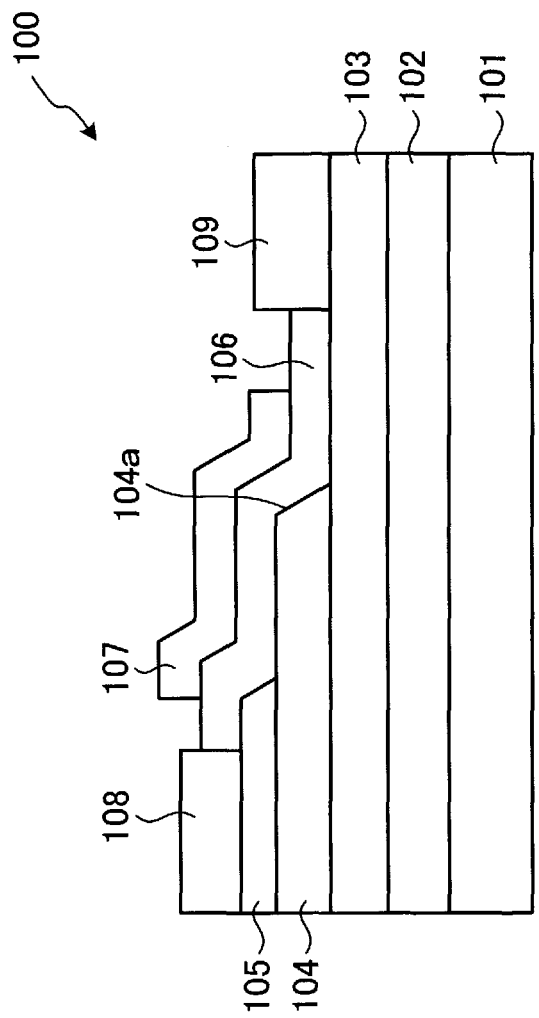
FIG. 1 is a schematic side view of a MOSFET according to a first embodiment of the present invention.

FIG. 1 is a schematic side view of a MOSFET 100 according to a first embodiment of the present invention. The MOSFET 100 is configured in such a manner that a buffer layer 102 formed with alternate layers of AlN and GaN, and an n-GaN layer 103 are formed on a substrate 101 made of sapphire, SiC, Si, or the like. A p-GaN layer 104 and a drain electrode 109 are formed on portions of the n-GaN layer 103, and an n$^+$GaN layer 105 as a contact layer is formed on a portion of the p-GaN layer 104. A source electrode 108 is formed on the n$^+$GaN layer 105. An SiO$_2$ film 106 is formed over the n$^+$GaN layer 105, the p-GaN layer 104, and the n-GaN layer 103 between the source electrode 108 and the drain electrode 109. A gate electrode 107 is formed on the SiO$_2$ film 106 in such a manner that the gate electrode 107 is laminated along with an end portion 104a of the p-GaN layer 104 on the side of the drain electrode 109. Specifically, a MOS structure by gate electrode/SiO$_2$/p-GaN layer is formed on the end portion 104a of the p-GaN layer 104. Therefore, if the bias is applied to the gate electrode 107, an n-channel is formed near the end portion 104a of the p-GaN layer 104. The n-channel is electrically connected to the n-GaN layer 103 thereby functioning as the MOSFET.

In the MOSFET 100, the n-GaN layer 103 functions as a RESURF layer for increasing breakdown voltage characteristic. The n-GaN layer 103 as the RESURF layer and the n$^+$GaN layer 105 are formed by an epitaxial growth in the MOSFET 100, and each of the n-GaN layer 103 and the n$^+$GaN layer 105 has high crystalline with less inactive impurity. As a result, the MOSFET 100 can be such MOSFET that has high electron mobility, causes little leakage current, and is low ON-resistance.

Furthermore, the MOSFET 100 is not fabricated by the ion implantation method, so that it is not necessary to perform the annealing process at a high temperature for a long time for sufficiently activating the impurity. Therefore, pits do not occur on the surface of a GaN crystal, maintaining the channel mobility at a desired level.

A method of fabricating the MOSFET 100 is explained below. The buffer layer 102, the n-GaN layer 103, a p-GaN layer for forming the p-GaN layer 104, and an n$^+$GaN layer for forming the n$^+$GaN layer 105 are formed in that order on the substrate 101 by the epitaxial growth using a metal organic chemical vapor deposition (MOCVD) method. In this case, a dopant to be doped to the p-GaN layer is Mg, and Mg doping concentration is approximately $5 \times 10^{15}$ cm$^{-3}$ to $1 \times 10^{17}$ cm$^{-3}$. On the other hand, a dopant to be doped to the n-GaN layer 103 and the n$^+$GaN layer is Si, and Si doping concentration is approximately $1 \times 10^{17}$ cm$^{-3}$ for the n-GaN layer 103 and $1 \times 10^{19}$ cm$^{-3}$ for the n$^+$GaN layer. The n-GaN layer 103 is formed with a thickness of about 1 micrometer so that the n-GaN layer 103 can function as the RESURF layer.

Portions of the n$^+$GaN layer and the p-GaN layer are patterned by a photolithography and etched, so that the p-GaN layer 104 and the n$^+$GaN layer 105 are formed and a portion of the surface of the n-GaN layer 103 is exposed. At this state, it is preferable to use a dry etching method such as an inductively coupled plasma (ICP) dry etching.

The SiO$_2$ film 106 with a thickness of 100 nanometers is deposited on the entire top surface of the substrate 101 for forming a MOS structure, and the annealing process is performed for 30 minutes at a temperature of 900° C. in the presence of N$_2$ to lower interface state of the SiO$_2$ film 106. Subsequently, poly-Si with a thickness of 650 nanometers is deposited, which is to be the gate electrode. The substrate 101 is annealed for 20 minutes in a furnace with an internal temperature of 900° C. in the presence of POCl3, so that p-doping is performed to the poly-Si to fabricate the poly-Si to be n+-type. A photolithography for defining a gate region is performed and unnecessary poly-Si is etched through reactive ion etching (RIE) to fabricate the gate electrode 107. The gate electrode 107 is laminated along with the end portion 104a of the p-GaN layer 104.

Portions of the SiO$_2$ film 106 are etched thereby the n+GaN layer 105 and the n-GaN layer 103 are exposed. The source electrode 108 is fabricated on the exposed n+GaN layer 105 and the drain electrode 109 is fabricated on the exposed n-GaN layer 103, so that the MOSFET 100 is completely fabricated.

As described above, the MOSFET 100 is an FET that has a low ON-resistance with high breakdown voltage characteristic and channel mobility.

A MOSFET 200 according to a second embodiment of the present invention is described below. The MOSFET 200 is different from the MOSFET 100 in that a contact layer against the source electrode is formed in the p-GaN layer by the ion implantation method, and other configurations are the same as that of the MOSFET 100.

Figure 2:
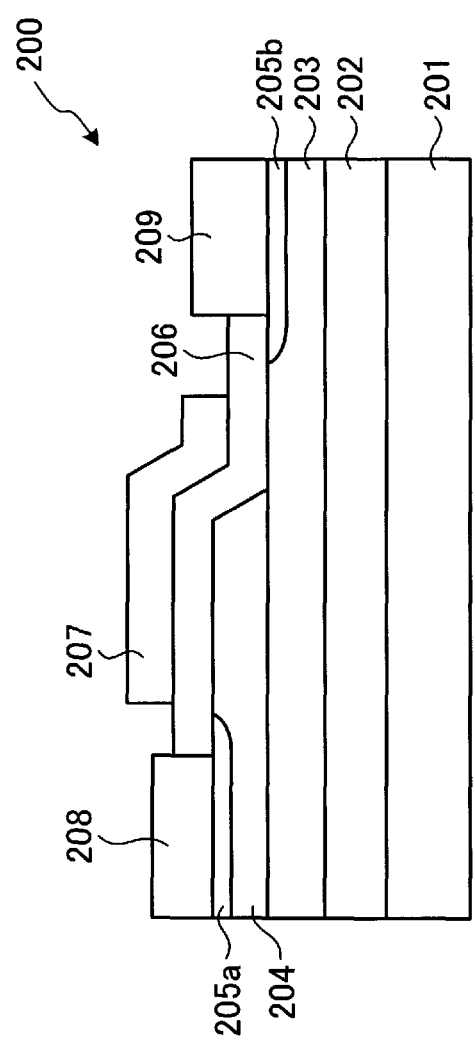
FIG. 2 is a schematic side view of a MOSFET according to a second embodiment of the present invention.

FIG. 2 is a schematic side view of the MOSFET 200. Similar to the MOSFET 100, the MOSFET 200 is configured with a buffer layer 202, an n-GaN layer 203, a p-GaN layer 204, an SiO$_2$ film 206, a gate electrode 207, a source electrode 208, and a drain electrode 209 formed on a substrate 201. An n+GaN region 205a is formed in the p-GaN layer 204 by the ion implantation method and functions as the contact layer against the source electrode 208. Furthermore, an n+GaN region 205b is formed in the n-GaN layer 203 by the ion implantation method and functions as the contact layer against the drain electrode 209.

Similar to the MOSFET 100, the n-GaN layer 203 serving as the RESURF layer is formed by the epitaxial growth in the MOSFET 200, so that the crystalline of the n-GaN layer 203 increases and little inactive impurity is contained. Therefore, the MOSFET 200 can be such MOSFET that has high electron mobility, causes little leakage current, and is low ON-resistance.

The MOSFET 200 is fabricated in the same manner as that of the MOSFET 100. Specifically, the buffer layer 202, the n-GaN layer 203, and a p-GaN layer for forming the p-GaN layer 204 are formed in that order on the substrate 201 by the epitaxial growth using a MOCVD method. Then, portions of the p-GaN layer are patterned by a photolithography and etched, so that the p-GaN layer 204 is formed.

A mask used for implanting ion to fabricate the n+GaN regions 205a and 205b is formed through the following processes. An SiO$_2$ film with a thickness of 1000 nanometers is deposited on an entire top surface of the substrate 101 (the substrate 101 on which the buffer layer 102, the n-GaN layer 103, and the p-GaN layer 104 are formed is collectively referred to as the substrate 101 as appropriate) by a plasma enhanced chemical vapor deposition (p-CVD) method. Subsequently, portions of the SiO$_2$ film 111, which correspond to regions of the n+GaN regions 205a and 205b, are etched by using a mask obtained by the photolithography. An SiO$_2$ film with a thickness of 20 nanometers for protecting a surface is deposited on an entire surface of the SiO$_2$ film 111. The Si ion is subsequently implanted into the substrate on which the mask is formed through the above process to fabricate the n+GaN regions 205a and 205b. The dose amount for the ion implantation is preferably $3 \times 10^{15}$ cm$^{-2}$.

The entire SiO$_2$ films are removed by BHF, and a cap layer is deposited on the entire top surface of the substrate 101 as a protection layer for performing an annealing process, in which impurity ion is freshly activated. The cap layer is made of SiO$_2$ according to the first embodiment; however, the cap layer can be made of AlN, graphite, or the like. The annealing process is further performed for activating impurity ion included in the n+GaN regions 205a and 205b. The annealing process is performed for 5 minutes in an annealing furnace with a temperature of 1200° C. in the presence of N$_2$. According to the above fabrication method, the n+GaN regions 205a and 205b are targeted to activate the impurity ion, where the dose amount is substantially large and impurity ion is easily activated, so that the annealing process is not necessarily performed for a long time at a high temperature. Accordingly, pits hardly occur on the surface of GaN crystal and channel mobility is hardly degraded. After completing the annealing process, the cap layer is removed by an appropriate method such as a method using the BHF.

The SiO$_2$ film 206, the gate electrode 207, the source electrode 208, and the drain electrode 209 are formed in the same manner as in the MOSFET 100, thereby the MOSFET 200 is completely fabricated.

A MOSFET 300 according to a third embodiment of the present invention is described below. The MOSFET 300 is different from the MOSFET 200 in that an n-GaN region is formed on an end portion of the p-GaN layer on the side of the drain electrode, and other configurations are the same as that of the MOSFET 200.

Figure 3:
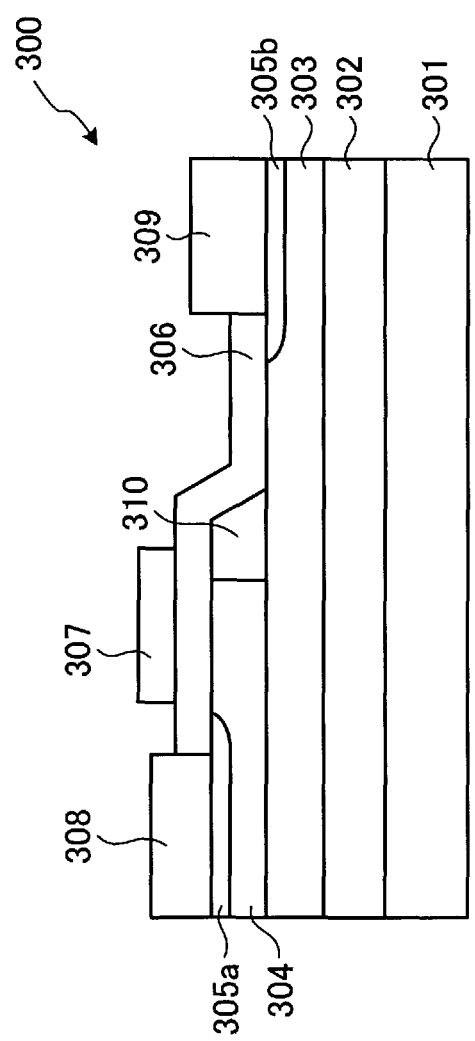
FIG. 3 is a schematic side view of a MOSFET according to a third embodiment of the present invention.

FIG. 3 is a schematic side view of the MOSFET 300. Similar to the MOSFET 200, the MOSFET 300 is configured with a buffer layer 302, an n-GaN layer 303, a p-GaN layer 304, n+GaN layers 305a and 305b, an SiO$_2$ film 306, a gate electrode 307, a source electrode 308, and a drain electrode 309 formed on a substrate 301. An n-GaN region 310 as a channel forming region is formed on an end portion of the p-GaN layer 304 on the side of the drain electrode 309. Therefore, if the bias is applied to the gate electrode 307 in the MOSFET 300, an n-channel is formed in the n-GaN region 310, and the n-channel is electrically connected to the n-GaN layer 303.

Similar to the MOSFET 200, the n-GaN layer 303 serving as the RESURF layer is formed by the epitaxial growth in the MOSFET 300, so that the crystalline of the n-GaN layer 303 increases and little inactive impurity is contained. Therefore, the MOSFET 300 can be such MOSFET that has high electron mobility, causes little leakage current, and is low ON-resistance.

The MOSFET 300 is fabricated in the below manner during the fabricating process of the MOSFET 200. Specifically, an SiO$_2$ film for implanting ions is formed, a predetermined portion of the SiO$_2$ film is etched, and Si ions are implanted to the etched portion to form the n+GaN layers 305a and 305b and the n-GaN region 310. A dose amount of ions to be implanted to form the n-GaN region 310 is approximately $3 \times 10^{15}$ cm$^{-2}$.

A MOSFET 400 according to a fourth embodiment of the present invention is described below. The MOSFET 400 is different from the MOSFET 300 in that a conductive type of the substrate is n+-type, a backside electrode is formed on the backside of the substrate, and the source electrode is formed to electrically connect the substrate to the contact layer. Other configurations are the same as that of the MOSFET 300.

Figure 4:
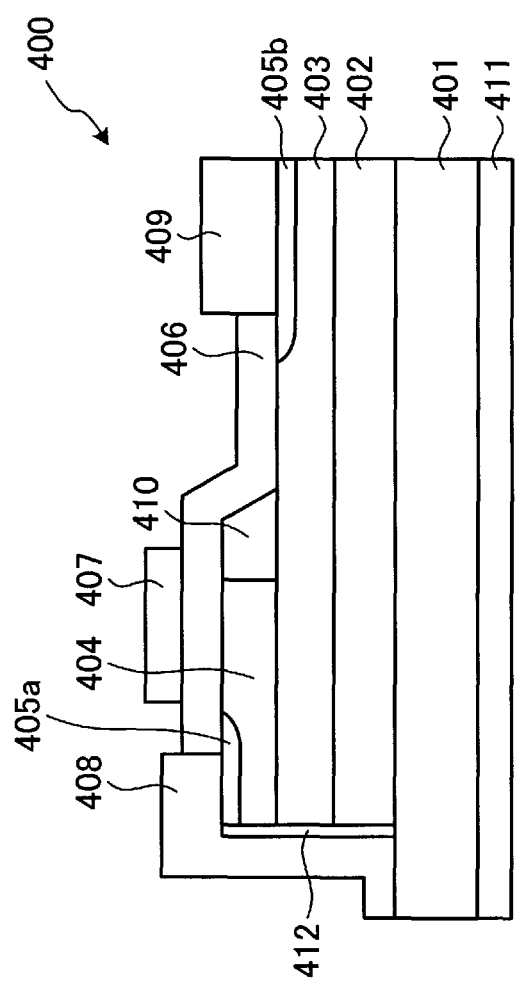
FIG. 4 is a schematic side view of a MOSFET according to a fourth embodiment of the present invention.
Figure 5:
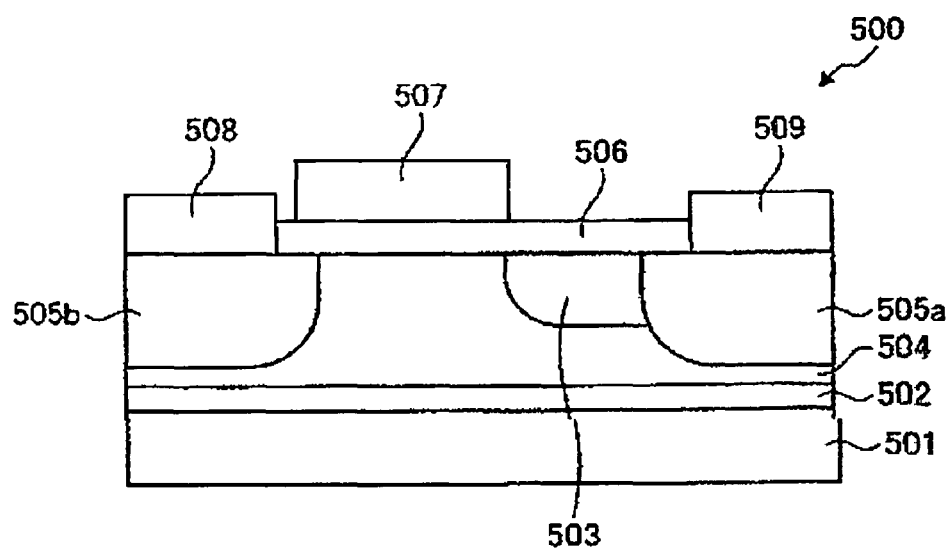
FIG. 5 is a schematic side view of a conventional MOSFET.

FIG. 4 is a schematic side view of the MOSFET 400. The MOSFET 400 includes a substrate 401 made of an Si semiconductor is n+-type and a backside electrode 411 formed on the backside of the substrate 401 and made of metal to be in ohmic contact with the substrate 401. Similar to the MOSFET 300, the MOSFET 400 is configured with a buffer layer 402, an n-GaN layer 403, a p-GaN layer 404, n+GaN layers 405a and 405b, an SiO$_2$ film 406, a gate electrode 407, a drain electrode 409, and an n-GaN region 410 formed on the substrate 401. Furthermore, a source electrode 408 is formed in such a manner that the n+GaN layer 405*a* is electrically connected to the substrate 401 via the source electrode 408. Accordingly, the backside electrode 411 is also electrically connected to the source electrode 408. Moreover, an insulating layer 412 made of $SiO_2$ is formed between the source electrode 408 and each of end portions of the buffer layer 402, the n-GaN layer 403, the p-GaN layer 404, and the n+GaN layer 405*a*.

Similar to the MOSFET 300, the MOSFET 400 can be such MOSFET that has high electron mobility, causes little leakage current, and is low ON-resistance. Furthermore, the backside electrode 411 can be used as the source electrode in the MOSFET 400, a bonding pat for connecting the source electrode 408 is not necessary, reducing a chip area. Moreover, the backside electrode 411 and the source electrode 408 have the same electric potential, so that local concentration of the electric field between the gate and the drain electrodes can be reduced by the backside electrode and breakdown voltage characteristic can be enhanced. Furthermore, because the insulating layer 412 is formed, it is possible to prevent short between the source and the drain electrodes via the n-GaN layer 403.

The MOSFET 400 is fabricated in the same manner as that of the MOSFET 300. At this state, the source electrode 408 and the backside electrode 411 are formed in such a manner that a portion of the $SiO_2$ film 406 overlapping with the n+GaN layer 405*a* is etched, and portions of the n+GaN layer 405*a*, the p-GaN layer 404, the n-GaN layer 403, and the buffer layer 402 are etched to form opening holes to the surface of the substrate 401. Then, the insulating layer 412 and the source electrode 408 are formed in that order. After forming the drain electrode 409, the backside of the substrate 401 is polished and a metal film is doped to the polished backside to form the backside electrode 411.

To form the n-GaN region in the p-GaN layer, a diffusion method can be employed instead of the ion implantation method described in the third and the fourth embodiments. Furthermore, the present invention can be applied to a p-type MOSFET instead of the n-type MOSFET described in the above embodiments.

As describe above, according to an aspect of the present invention, a filed effect transistor with low ON-resistance and high breakdown voltage characteristic can be realized.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A field effect transistor having a metal-oxide-semiconductor structure made of nitride compound semiconductor, the field effect transistor comprising:
   a substrate;
   a buffer layer formed on the substrate;
   a reduced surface field layer of a first conductive type formed on the buffer layer;
   a semiconductor layer of a second conductive type formed on a portion of the reduced surface field layer;
   a contact layer of the first conductive type formed in or on the semiconductor layer;
   a source electrode formed on the contact layer;
   a drain electrode formed on the reduced surface field layer such that the drain electrode does not overlap the semiconductor layer;
   a gate insulating film formed on the semiconductor layer such that the gate insulating film overlaps with an end portion of the semiconductor layer; and
   a gate electrode formed on the gate insulating film such that the gate electrode overlaps with the end portion of the semiconductor layer, wherein
   a channel formed near the end portion of the semiconductor layer is electrically connected to the reduced surface field layer, and wherein
   the buffer layer, the reduced surface field layer, the semiconductor layer and the contact layer are formed on the substrate in the recited order.

2. The field effect transistor according to claim 1, wherein the substrate is n+-type, a backside electrode is formed on a backside of the substrate, and the source electrode is formed such that the substrate is electrically connected to the contact layer via the source electrode.

3. A field effect transistor having a metal-oxide-semiconductor structure made of nitride compound semiconductor, the field effect transistor comprising:
   a substrate on which a buffer layer is formed;
   a reduced surface field layer of a first conductive type formed on the buffer layer;
   a semiconductor layer of a second conductive type formed on a portion of the reduced surface field layer;
   a contact layer of the first conductive type formed in or on the semiconductor layer;
   a source electrode formed on the contact layer;
   a drain electrode formed on the reduced surface field layer such that the drain electrode does not overlap the semiconductor layer;
   a channel forming region of the first conductive type formed on an end portion of the semiconductor layer on the drain electrode side;
   a gate insulating film formed on the semiconductor layer such that the gate insulating film overlaps with the channel forming region; and
   a gate electrode formed on the gate insulating film such that the gate electrode overlaps with the channel forming region, wherein
   a channel formed on the channel forming region is electrically connected to the reduced surface field layer, and wherein
   the buffer layer, the reduced surface field layer, the semiconductor layer and the contact layer are formed on the substrate in the recited order.

4. The field effect transistor according to claim 3, wherein the substrate is n+type, a backside electrode is formed on a backside of the substrate, and the source electrode is formed such that the substrate is electrically connected to the contact layer via the source electrode.

* * * * *